United States Patent [19]

Hartleroad et al.

[11] 3,911,568

[45] Oct. 14, 1975

[54] METHOD AND APPARATUS FOR BONDING MINIATURE SEMICONDUCTOR PILL-TYPE COMPONENTS TO A CIRCUIT BOARD

[75] Inventors: Ronald J. Hartleroad, Twelve Mile; James P. Grabowski, Carmel, both of Ind.

[73] Assignee: General Motors Corporation, Detroit, Mich.

[22] Filed: Nov. 18, 1974

[21] Appl. No.: 524,975

[52] U.S. Cl. .................... 29/626; 29/588; 29/471.3; 228/4

[51] Int. Cl.[2] ........................................... H05K 3/34

[58] Field of Search .......... 29/576 S, 588, 626, 627, 29/628, 471.1, 471.3; 228/4–6

[56] References Cited

UNITED STATES PATENTS

| | | | |
|---|---|---|---|
| 3,517,438 | 6/1970 | Johnson et al. | 29/627 |
| 3,544,857 | 12/1970 | Byrne et al. | 29/627 X |
| 3,655,177 | 4/1972 | Coucoulas | 228/4 X |
| 3,700,155 | 10/1972 | Hermanns | 228/3 |

*Primary Examiner*—Al Lawrence Smith
*Assistant Examiner*—K. J. Ramsey
*Attorney, Agent, or Firm*—Robert J. Wallace

[57] ABSTRACT

A method and apparatus for transferring miniature semiconductor pill-type components from a temporary carrier lead frame and directly bonding them to a printed circuit board. Each pill-type component has a semiconductor device chip encapsulated in a plastic body and an array of leads for the chip radially extending from the body. The lead frame with a plurality of pill-type components temporarily attached to it is held above a printed circuit board having a plurality of printed conductors thereon which correspond to the component leads. A hollow, heated transfer and soldering tool is positioned over a component. Alignment of the component leads with the circuit board conductors is accomplished while looking through the hollow tool. The tool is then pressed against the component leads to simultaneously form them and bring them into registered engagement with the circuit board conductors for soldering. Lead frame holding tabs serving as a temporary component support are automatically pulled from the component body just before the lead-conductor engagement by coaction with slots in the tool.

4 Claims, 10 Drawing Figures

METHOD AND APPARATUS FOR BONDING MINIATURE SEMICONDUCTOR PILL-TYPE COMPONENTS TO A CIRCUIT BOARD

BACKGROUND OF THE INVENTION

This invention relates to a method and apparatus for bonding miniature semiconductor components to a printed circuit board. More particularly, it involves a method and apparatus for bonding semiconductor pill-type components to a printed circuit board directly from a lead frame serving as a temporary carrier.

The semiconductor pill-type component is a plastic encapsulated semiconductor device package. In the package, a semiconductor device chip is encapsulated in a plastic body and an array of leads radially extend outwardly from the body. The semiconductor device chip may be a discrete transistor or diode, but generally would be an integrated circuit chip. Inner portions of the leads within the plastic body are connected to various contact areas on the chip. The portions of the leads outside the body provide means for electrical interconnection between the chip and external circuitry.

A principal advantage of the "pill" package design is that it is a low cost subassembly that can be readily tested before mounting in another product. Briefly, the pills are made by bonding semiconductor device chips to leads on a lead frame that serves as a temporary carrier. Each group of leads on the frame includes at least two pill holding tabs that are not electrically functional. The chips are each separately encapsulated with plastic to form a tablet-shaped body, a pill, with outer portions of the chip leads left exposed. All leads, except the supporting holding tabs, are severed from the lead frame. Each chip is then tested while it is still attached to the lead frame by the holding tabs. Those pills meeting acceptable standards are removed from the lead frame and subsequently mounted onto a larger lead structure for reencapsulation as a dual-in-line package (DIP). The miniature size and shape of the pill readily facilitates bonding it inside the DIP which in turn can be mounted onto a printed circuit board or the like by conventional techniques.

It would be highly advantageous to transfer the pill from its own temporary carrier lead frame and directly bond it to a printed circuit board. Accordingly, the time and expense of bonding the pill within the DIP could be eliminated. This would permit the high volume manufacture to bond a semiconductor chip to a lead frame, encapsulate it, test it, and then transfer and bond it directly to a printed circuit board for use in a wide variety of applications.

In our U.S. Pat. application, Ser. No. 525,022, filed Nov. 18, 1974, "Method and Apparatus For Bonding Semiconductor Pill-Type Components to a Circuit Board," the circuit board had an opening in it for receiving the component body and the body was urged into the opening while currently engaging the component leads with their corresponding circuit board conductors. In contrast, the present invention provides means by which the pill-type component can be directly soldered to a circuit board without such an opening.

OBJECTS AND SUMMARY OF THE INVENTION

It is a general object of this invention to provide an efficient, high volume production method and apparatus for transferring a semiconductor pill-type component from a temporary carrier lead frame and bonding it directly to a printed circuit board. It is another object of this invention to provide a combination transfer and soldering device which promotes easy component lead-circuit board conductor alignment and which further provides excellent electrical and mechanical connection therebetween.

Briefly, a lead frame having a plurality of spaced miniature semiconductor pill-type components temporarily attached thereto is supported closely above a printed circuit board. Each pill-type component includes a plastic body encapsulating a semiconductor device chip and an array of leads for the chip radially extending from the body. The printed circuit board has a plurality of convergent spaced solder coated printed conductors thereon corresponding to the component leads. A heated combination transfer and soldering tool is then positioned over one of the components. The tool is hollow and has an end surface with slots therein corresponding with lead frame holding tabs which temporarily attach each component to the lead frame. An operator can look through the tool to align inner portions of the component leads with the circuit board conductors. Once the component leads and circuit board conductors are aligned, the tool is lowered to engage the component leads and bend them toward the circuit board conductors. As the tool is further lowered, the holding tabs coact with the slots in the tool and are automatically pulled from the component body just before the tool forms the component leads and presses them securely against their corresponding circuit board conductors. The component leads are then all simultaneously soldered to the circuit board conductors by the heated tool.

DESCRIPTION OF THE PREFERRED EMBODIMENTS

Figure 1:
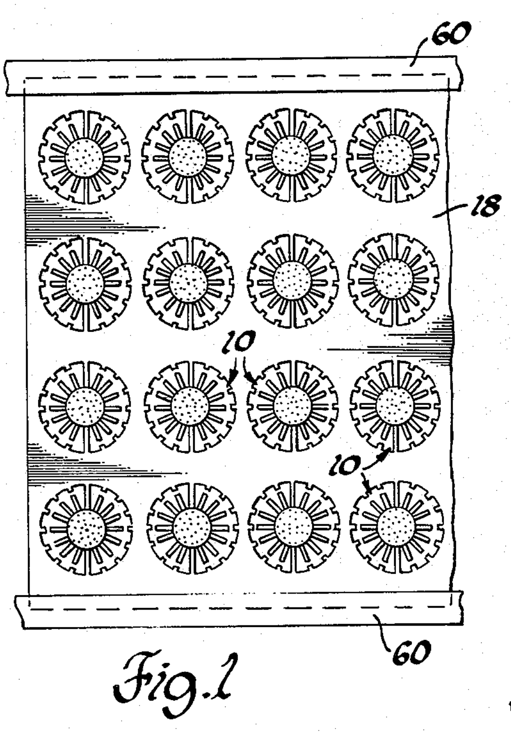
FIG. 1 is a plan view showing a temporary carrier lead frame having a plurality of semiconductor pill-type components attached thereto.

Referring now to the drawings, a semiconductor pill-type component, hereinafter referred to as a pill, is generally designated by the numeral 10. In this embodiment, each pill 10 includes a semiconductor chip 12 which may be an integrated circuit die approximately 38 mils square. Preferably, the chip 12 is an integrally leaded device. For example, chip 12 is a semiconductor flip chip having a plurality of integral leads, or contact bumps 14, on a major face thereof. The contact bumps 14 are extensions of a conductor pattern on the face of chip 12 and provide electrical interconnection points which facilitate bonding to larger conductive leads 16. A plurality of radially extending leads 16 have inner free end portions which are bonded to the contact bumps 14 of chip 12. The leads 16 were once an integral part of lead frame 18.

Before pills 10 were formed on lead frame 18 each group of pill leads 16 were the free ends of a plurality of spaced apart sets of mutually convergent cantilevered leads on the lead frame. The lead frame 18 can be made of Alloy 42 which is an alloy containing, by weight, about 41.5% nickel, 0.5% carbon, 0.5% manganese, 0.25% silicon, and the balance iron. The lead frame 18 in this example is about 0.0025 inch thick. The lead frame 18 also includes two diametrically opposite holding tabs 20. Holding tabs 20 are integral extensions of lead frame 18 similar to leads 16 before the pills were formed. However, as can be seen most clearly in FIG. 2, holding tabs 20 are shorter than leads 16 and are not bonded to any of the contact bumps 14 on chips 12.

A plastic encapsulation or body 22 surrounds the flip chip 12, inner portions of leads 16, and the inner portions of holding tabs 20. In this example, holding tabs 20 are embedded about 0.03 inch into body 22. The body 22 provides a protective housing for the chip 12. The plastic encapsulation of body 22 can be a plastic resin such as Polyset No. 410-B. In this embodiment, body 22 is a disc-shaped right cylinder with a diameter of about 0.14 inch and is about 1/16 inch thick. As can be seen most clearly in FIGS. 1–3, the holding tabs provide a temporary support for the pill 10. It should be noted that there can be several hundred pills supported on one lead frame structure. By the term pill-type component or pill we mean a miniature semiconductor device subassembly package having a plastic body encapsulating a semiconductor device chip and an array of discrete leads for the chip radially extending from the body. The pill body may be other than disc-shaped, if desired. Analogously, the lead array need not be symmetrical.

Referring now especially to FIGS. 4, 6, 7 and 10, there is shown a combination transfer and soldering device generally designated as 24. The device 24 includes an open ended, hollow tubular tool 26 constructed of stainless steel. While this material is preferred, others having rigid and thermally conductive characteristics, such as copper, can be used as a substitute therefor. Tool 26 is shown with a thicker upper portion as compared to the lower portion. The thicker upper portion provides good heat transfer properties and rigidity for tool 26. The lower portion of tool 26 has an outside diameter of about 0.26 inch and an inside diameter of 0.20 inch. As will become more apparent in the method of our invention, the inside diameter of tool 26 is chosen to allow an operator to view the inner portions of leads 16 for alignment purposes.

Tool 26 has a chamfered end surface 28 adapted to engage component leads 16. The chamfer begins about 0.06 inch above end surface 28 and converges inwardly so as to narrow the outside diameter of end surface 28 to about 0.25 inch. End surface 28 includes two diametrically opposed slots therein. Slots 30 are about 0.06 inch high and about 0.03 inch wide. Slots 30 correspond to holding tabs 20. Preferably, the width of slots 30 should be about 200% the width of holding tabs 20. In this example tool 26 is shown as one unitary piece. However, if desired, the lower portion of the tool can be interchangeable. That is, it can be adapted so it can be threaded into the upper portion of the tool, similar to conventional soldering iron tips.

Preferably, device 24 has a radially extending arm 32 in heat transfer relation with tool 26. In this example, arm 32 is a solid rod of stainless steel which is about ½ inch in diameter and about 8 inches in length. The arm 32 has been welded to tool 26. The angle of attachment and shape of arm 32 can be varied as desired to fit space limitation, etc. A heating coil 34 surrounds the lower portion of arm 32 closest to tool 26. Heating coil 34 is series connected with a switch 36 and a current source 38 which has been labeled "heater" for purposes of illustration. Two clamps 40 surrounding arm 32 connect device 24 to a supporting indexing mechanism 42. The indexing mechanism 42 provides means, through tool extension arm 36, for applying downward force of about 20 psi to tool 26. It similarly provides means for lifting tool 26.

A printed circuit board 44 has a plurality of printed conductors 46 on one face thereof. By printed circuit board we mean an insulative substrate, having a plurality of electrically conductive paths or conductors on a major face of the substrate providing electrical interconnection between various component locations on the substrate. The substrate, for example, can be of ceramic or of a phenolic resin impregnated with cloth or paper laminate. The conductors 46 have spaced, mutually convergent inner end portions 46' which correspond to the pattern of pill leads 16. The ends of inner portions 46' form a circular pattern with a diameter of about 0.16–0.18 inch. This diameter is smaller than the diameter defined by the outermost portions of pill leads 16 which is about 0.26 inches. The bore defining the inside diameter of tool 26 is thus chosen to be larger than pill body 22 and the pattern defined by the conductor inner portions 46', yet smaller than pattern defined by the outermost portions of pill leads 16. In such manner, observation of lead-conductor registration may be had by looking through the bore in tool 26.

Figure 4:
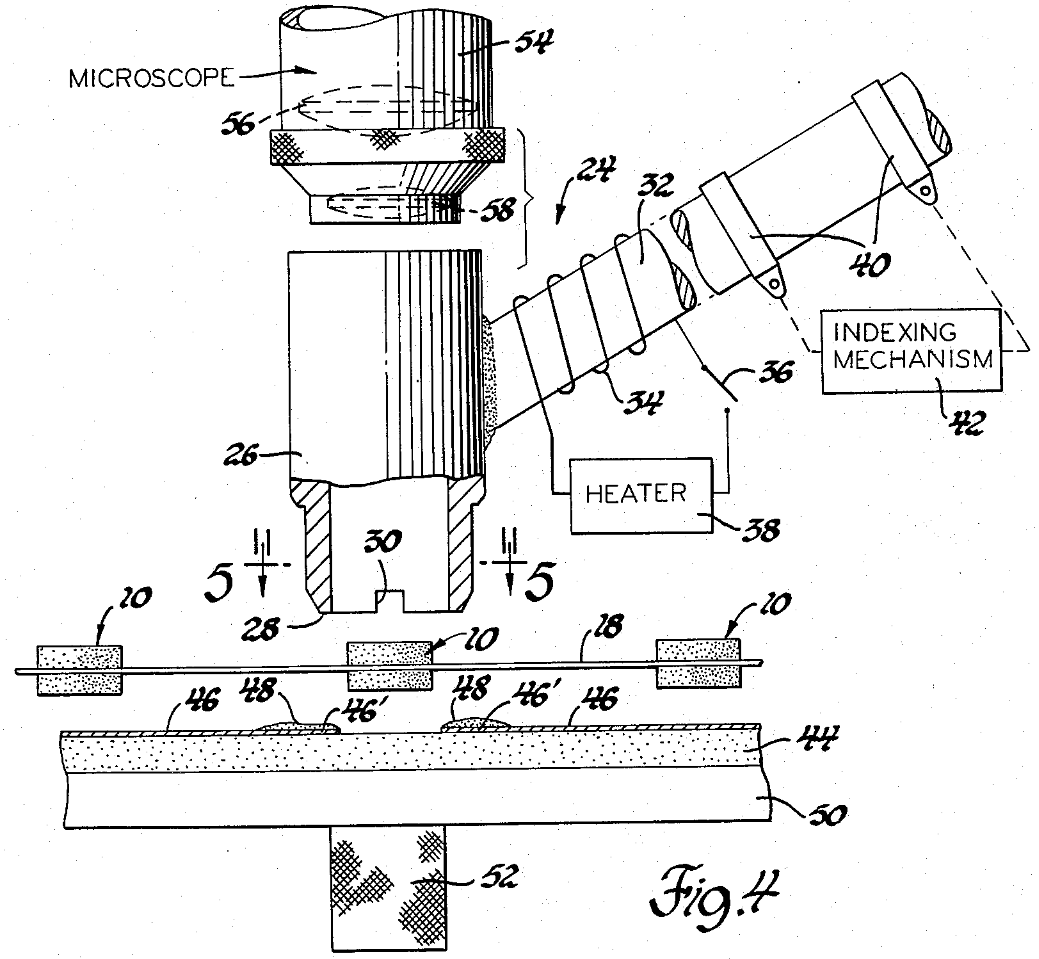
FIG. 4 is an elevational view with parts broken away showing one embodiment of the apparatus embodied in this invention.
Figures 5, 6, 7, 8, 9, 10:
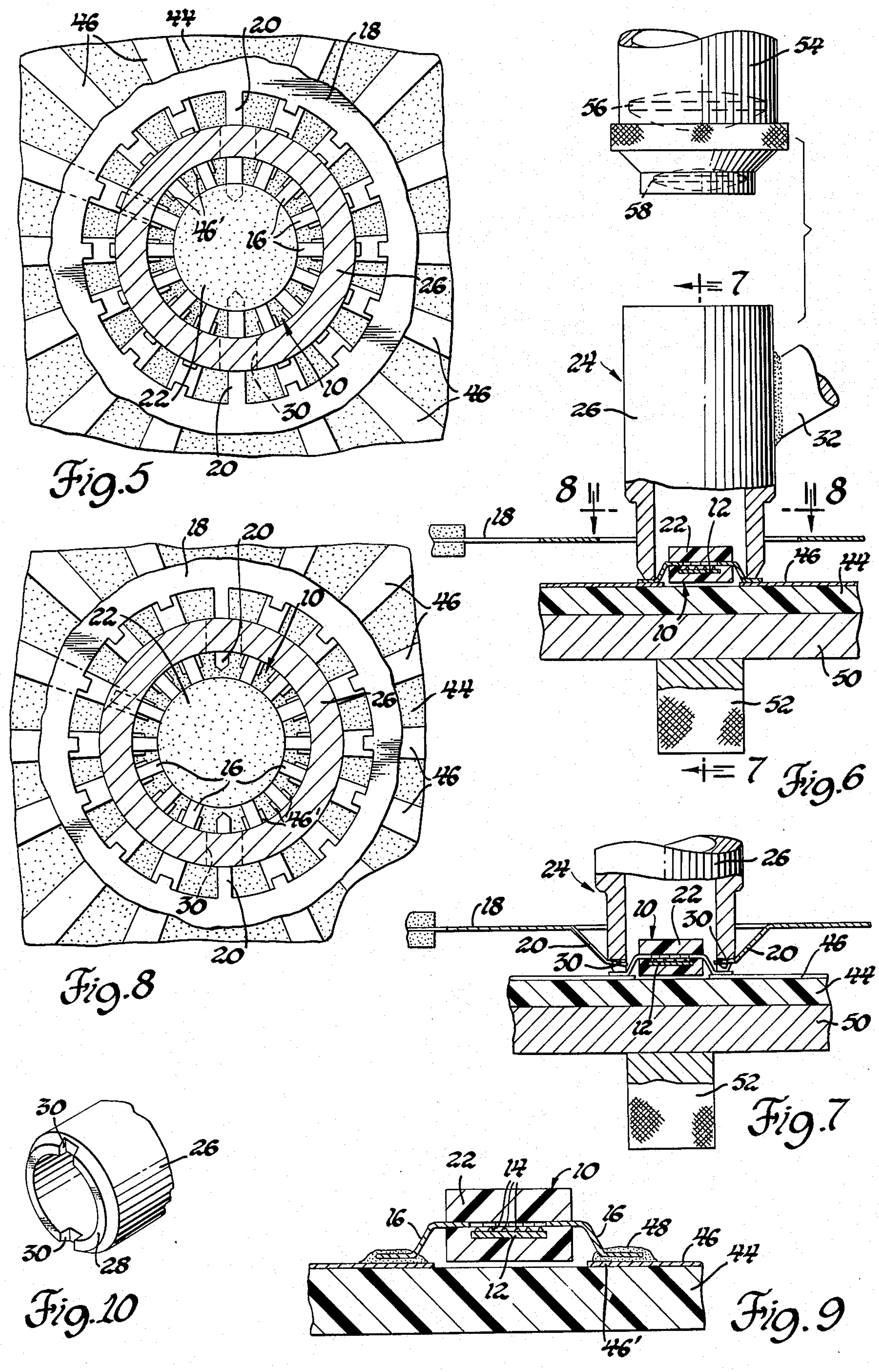
FIG. 5 is an enlarged fragmentary view along the lines 5—5 of FIG. 4.
FIG. 6 is a sectional view in partial elevation of the apparatus shown in FIG. 4 during a succeeding step of the method of this invention.
FIG. 7 is a fragmentary sectional view along the lines 7—7 of FIG. 6.
FIG. 8 is a view similar to FIG. 5 along the lines 8—8 of FIG. 6.
FIG. 9 is an enlarged sectional view showing a semiconductor pill-type component soldered to a circuit board.
FIG. 10 is an enlarged fragmentary perspective view of the combination transfer and soldering tool shown in FIGS. 4-7.

The inner portions 46' of circuit board conductors 46 have a thin layer of solder 48 thereon which is shown only in FIGS. 4 and 9 for sake of clarity in the drawings. The circuit board 44 is disposed on a supporting alignment table 50. For ease of illustration, the alignment table is shown merely as a plate with a knob 52 attached thereto. However, it should be understood that other well known means for vertical, horizontal and rotational alignment of circuit board 44 can be used. A representation of a microscope 54 is shown in FIGS. 4 and 6. The microscope includes an objective lens 56 and a focal lens 58. The microscope 54 is positioned coaxially above tool 26. It should be understood that other visual enlargement means can also be used as a substitute for microscope 54.

According to the method of our invention, flip chip 12 is aligned with the leads 16 of lead frame 18 so that the contact bumps 14 each engage their respective inner portion of leads 16. At this stage of the operation, leads 16 are still an integral part of lead frame 18. The contact bumps 14 are soldered to leads 16, as by hot gas bonding. This alignment and bonding can be that as described and claimed in U.S. Ser. No. 414,274, "Magnetic Alignment for Semiconductor Device Bonding," Hartleroad et al., filed Nov. 9, 1973, and which is assigned to the same assignee as the present invention.

Figure 2:
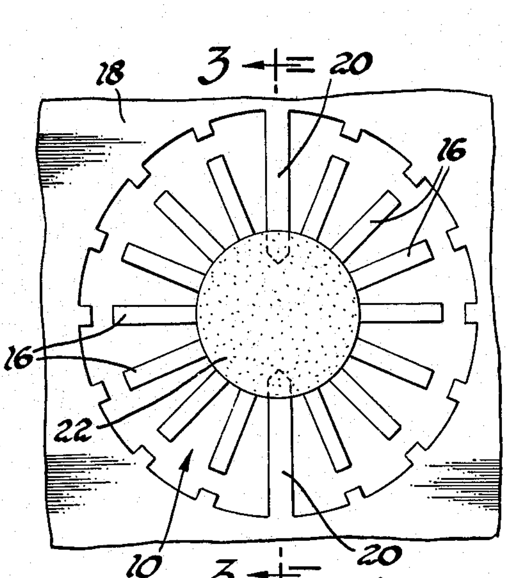
FIG. 2 is an enlarged fragmentary plan view of one of the semiconductor pill-type components shown in FIG. 1.
Figure 3:
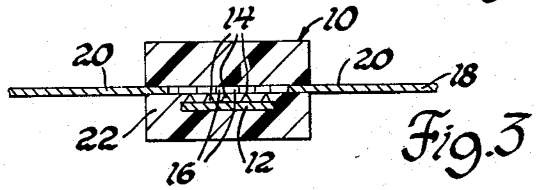
FIG. 3 is a sectional view along the lines 3—3 of FIG. 2.

The plastic encapsulation serving as body 22 is then molded around the flip chip 12, inner portions of leads 16, and the inner portions of holding tabs 20. Preferably, body 22 is formed by known injection molding processes. The individual leads 16 are then severed from the lead frame 18 to provide discrete leads for each pill 10 as shown in FIGS. 1 and 2. At this stage each pill 10 may be tested with suitable electronic testing equipment. It should be emphasized that holding tabs 20 are not severed from the lead frame 18 at this time. Hence, they provide a temporary support for each pill 10.

Peripheral portions of lead frame 18 are clamped and somewhat rigidly supported, for example, by a frame member designated by number 60. Lead frame 18 is then held parallel to and spaced about 0.125 inch from circuit board 44. The spacing between the lead frame 18 and the top of circuit board 44 can be varied somewhat. Preferably, however, it should be within 0.25 inch.

Tool 26 is then positioned over one of pills 10 as shown in FIG. 4. Microscope 54 is then positioned in mutual registration with tool 26 and pill 10. An operator looking through microscope 54 looks through the inside of hollow tool 26. He then aligns the inner portions 46' of circuit board conductors 46 with the pill leads 16 as shown in FIG. 5. This can be accomplished by moving alignment table 50 until the circuit board 44 is brought into proper orientation. It should be noted that holding tabs 20 are still connected to pill body 22. Switch 36 is closed to activate heating coil 34 thereby heating tool 26 to a temperature above the melting point of solder 48.

The next step is to actuate the indexing mechanism 42 to lower tool 26. The following transfer and bonding operation occurs in one continuous downward movement of tool 26 and is completed in a relatively short time of about 3 seconds. However, during this time there are three somewhat distinct occurrences and will be described as such. First, the end portion 28 of tool 26 engages the leads 16 and begins to bend them downwardly toward their respective circuit board conductors 46. However, at this point, the holding tabs 20 have not yet engaged the top of slots 30. Hence, the pill is still attached to the lead frame 18. Second, as tool 26 is further depressed the holding tabs abut the top of slots 30 and are pulled from the pill body 22. It is an important aspect of this invention that the holding tabs 20 do not pull out of the body until just before tool 26 has firmly pressed pill leads 16 against their respective circuit board conductors 46. Hence, pill, lead-circuit board conductor registration is not disturbed. Thirdly, tool 26 firmly presses the pill leads 16 against their respective circuit board conductors 46 as can be seen in FIGS. 6 and 7. As can be seen in FIGS. 7 and 8, the holding tabs 20 have been completely pulled away from the pill body 22 by the coaction with slots 30. The heated tool 26 solders all of the pill leads 16 simultaneously to their respective circuit board conductors 46. The chamfer on end surface 28 allows solder 48 to be drawn up over the leads 16 due to wetting of the tool thereby providing an excellent solder joint as can be seen in FIG. 9. The indexing mechanism 42 raises the tool 26 to leave the finished product, again shown in FIG. 9.

This process can be easily and rapidly repeated to bond other pills to other corresponding circuit board conductors. For example, a new pill is situated under tool 26 and a new circuit board bonding site is brought underneath it. Alignment of the pills leads and circuit board conductors is then accomplished as described herein. The indexing mechanism is actuated again to transfer and bond the new pill to its respective circuit board bonding site.

It should now be evident that we have invented an efficient method of bonding extremely small semiconductor pill-type components to a circuit board. By providing a method and apparatus for directly transferring a pill from the same lead frame in which the semiconductor chip was attached, handling problems of these miniature components are substantially reduced. Hence, the method and apparatus of this invention allows the high volume manufacturer to bond a semiconductor chip to a lead frame, encapsulate it, test it, and then transfer and bond it directly to a circuit board for use in a variety of applications. More importantly, however, is that our invention eliminates the necessity of packaging the pill in another larger package so that it in turn can be bonded to the circuit board. The larger package, such as the common dual-in-line package, was heretofore needed because prior art apparatus could not efficiently and accurately bond the miniature pill component directly to the circuit board. Hence, our invention eliminates the costly need for packaging these pills within another larger package in order to bond it to corresponding circuit board conductors.

What we claim as new and desire to secure by Letters Patent of the United States is:

1. A method of transferring a miniature semiconductor pill-type component from a lead frame temporary carrier and directly soldering said component to a printed circuit board, said method comprising:

supporting a lead frame having a plurality of spaced semiconductor pill-type components temporarily attached thereto, each component having a plastic body encapsulating a semiconductor device chip and a plurality of leads for said chip radially extending from the body, said components being temporarily attached to said lead frame by at least two holding tabs extending from said lead frame into said plastic component body;

holding said lead frame parallel with and within about 0.25 inch above a printed circuit board, said circuit board having a plurality of mutually spaced, convergent, solder-coated conductors thereon corresponding to said component leads;

positioning a tubular, open ended soldering tool over one of said components, said tool having an end surface adapted for engaging said component leads and having slots in peripheral portions of said end surface corresponding to said holding tabs, said tool having a vertical bore throughout its entire length that is larger than said component body yet smaller than the periphery defined by outer portions of said component leads;

positioning visual enlargement means above said tool in mutual registration with said bore;

aligning said component leads with said circuit board conductors while viewing inner portions of said leads and conductors by looking through said bore in said tool;

heating said tool;

moving said tool toward said circuit board to sequentially engage said component leads with said tool end surface, bend said leads toward said circuit board conductors, tear said holding tabs from said component body by coaction with said tool slots after maintenance of lead-conductor alignment is assured, and finally, to form and clamp said leads against their corresponding circuit board conductors; and soldering said component leads to their corresponding circuit board conductors with the heated tool.

2. A method of transferring a miniature semiconductor pill-type component from a lead frame temporary carrier and directly soldering said component to a printed circuit board, said method comprising:

supporting a lead frame having a plurality of spaced semiconductor pill-type components temporarily attached thereto, each component having a plastic disc-shaped body encapsulating a semiconductor device chip and a plurality of leads for said chip radially extending from the body, said components being temporarily attached to the lead frame by two diametrically opposite holding tabs extending from the lead frame into the component body;

holding said lead frame parallel with and about 0.125 inch above a printed circuit board, said circuit board having a plurality of mutually spaced, convergent, solder-coated conductors thereon corresponding to said component leads;

positioning a metallic, tubular, open-ended soldering tool over one of said pills, said tool having a chamfered flat end surface adapted for engaging said component leads and two diametrically opposite slots in said end surface corresponding to said holding tabs, said tool having a vertical bore extending throughout its entire length, said bore being circular with a diameter greater than the diameter of the component body yet less than the diameter defined by the periphery of said component leads;

positioning visual enlargement means above said tool in mutual registration with said bore;

aligning said component leads with said circuit board conductors while viewing inner portions of said leads and conductors by looking through said bore in said tool;

heating said tool above the melting point of the solder on said conductors;

moving said tool toward said circuit board to sequentially engage said components leads with said tool end surface, bend said leads toward said circuit board conductors, tear said holding tabs from said component body by coaction with said tool slots after maintenance of lead-conductor alignment is assured, and finally, to form and clamp said leads against their corresponding circuit board conductors; and soldering said component leads to their corresponding circuit board conductors with the heated tool.

3. In an apparatus for transferring a miniature semiconductor pill-type component from a temporary carrier lead frame and directly soldering said component to a printed circuit board, said apparatus including means for supporting a lead frame having a plurality of spaced semiconductor pill-type components temporarily attached thereto, each component having a disc-shaped plastic body encapsulating a semiconductor device chip with a diameter of $D_b$ and a plurality of discrete leads for said chip radially extending from the body with the outer portions of the leads defining a diameter of $D_l$, said lead frame having two diametrically opposite holding tabs partially extending into the component body and providing temporary support therefor, means for supporting a printed circuit board having a plurality of mutually spaced convergent solder coated conductors corresponding to said component leads, and visual enlargement means for viewing alignment of said component leads with their corresponding circuit board conductors; a combination transfer and soldering tool comprising:

a metallic, open ended tube, said tube having a bore extending longitudinally throughout its entire length, said bore being circular with a diameter larger than $D_b$ yet smaller than $D_l$ whereby one may view inner portions of said component leads and said circuit board conductors for purposes of alignment by looking through said bore in said tube with said visual enlargement means, said tube having a generally flat end surface adapted for engaging said component leads, two diametrically opposite slots in said tube end surface corresponding to said lead frame holding tabs, a rigid, metallic arm connected to said tube being spaced from said end surface and projecting from said tube, means for heating said tube communicating with said arm wherein heat is conductively transferred to said end surface to heat it to a temperature above the melting point of the solder on said circuit board conductors, and wherein means for downwardly moving said tube may cooperate with said arm to engage said tube end surface with said component leads to press them against said circuit board conductors for soldering and so that said lead frame holding tabs are automatically pulled from said component body by coaction with said slots in said tube end surface.

4. Apparatus for transferring a miniature semiconductor pill-type component from a temporary carrier lead frame and directly soldering said component to a printed circuit board, said apparatus comprising:

means for supporting a lead frame having a plurality of spaced semiconductor pill-type components temporarily attached thereto, each component having a plastic body encapsulating a semiconductor device chip and a plurality of discrete leads for said chip radially extending from the body, said lead frame having at least two holding tabs which extend partially into said component body thereby providing temporary support for said component;

means for supporting a printed circuit board having a plurality of mutually spaced, convergent solder-coated conductors thereon which correspond to said component leads;

means for maintaining said lead frame parallel with and within about 0.25 inch above said circuit board;

a combination transfer and soldering tool positioned above one of said components, said tool being a metallic, tubular open ended tube with an end surface adapted to engage said component leads, said tool having a bore extending throughout its entire length, said bore being larger than said component body yet smaller than the periphery defined by the outer portions of said component leads, at least two slots in said tool end surface corresponding to said holding tabs in the lead frame structure;

means for continually heating said tool end surface to a temperature above the melting point of the solder on said circuit board conductors;

visual enlargement means positioned above said tool in mutual registration with said bore wherein one can view inner portions of said component leads and conductors by looking through said bore in said tool;

means for aligning said component leads with their corresponding circuit board conductors wherein said alignment can be observed by looking through said bore in said tool;

means for moving said tool toward said circuit board to engage said tool end surface with said component leads to sequentially bend said component leads toward said circuit board conductors, automatically tear said lead frame holding tabs from said component body by coaction with said tool slots after maintenance of lead conductor alignment is assured and finally, to clamp said leads against their corresponding circuit board conductors thereby permanently soldering said component to said circuit board with the heated tool.

* * * * *